United States Patent [19]
Laube et al.

[11] Patent Number: 5,889,902
[45] Date of Patent: Mar. 30, 1999

[54] MONOLITHIC INTEGRATED OPTOELECTRONIC SEMICONDUCTOR COMPONENT AND PROCESS FOR MANUFACTURING THE SAME

[75] Inventors: Gert Laube; Michael Schilling, both of Stuttgart; Klaus Wünstel, Schwieberdingen; Wilfried Idler, Markgröningen; Karin Grosskopf, Oberriexingen; Eugen Lach, Marbach, all of Germany

[73] Assignee: Alcatel Alsthom Compagnie Generale d'Electricite, France

[21] Appl. No.: 800,949

[22] Filed: Feb. 14, 1997

[30] Foreign Application Priority Data

Feb. 16, 1996 [DE] Germany .................. 196 05 794.9

[51] Int. Cl.$^6$ .................. G02B 6/12; H01L 21/70
[52] U.S. Cl. .................. 385/14; 385/15; 385/31; 385/43; 385/45; 385/130; 385/131; 437/51; 437/165
[58] Field of Search .................. 385/2, 8, 9, 14, 385/15, 16, 24, 27, 31, 39, 40, 41, 43, 45, 130, 131; 437/51, 117, 134, 165, 141

[56] References Cited

U.S. PATENT DOCUMENTS

| | | | |
|---|---|---|---|
| 4,203,649 | 5/1980 | Velasco et al. | 385/14 X |
| 4,790,615 | 12/1988 | Seki et al. | 385/14 X |
| 4,966,430 | 10/1990 | Weidel | 385/14 X |

(List continued on next page.)

FOREIGN PATENT DOCUMENTS

| | | | |
|---|---|---|---|
| 0303825 | 2/1989 | European Pat. Off. | 385/14 X |
| 0345923 | 12/1989 | European Pat. Off. | 385/14 X |
| 0558089 | 9/1993 | European Pat. Off. | 385/14 X |

(List continued on next page.)

OTHER PUBLICATIONS

"Strained Quantum Wells for Polarization–Independent Electrooptic Waveguide Switches" by Zucker et al, Journal of Lightwave Technology, Bd. 10, Nr. 12, 1 Dec. 1992, pp. 1926–1930.

"High–speed MQW electroabsorption optical modulators integrated with low–loss waveguides" by Ido et al, IEEE Photonics Technology Letters, Bd. 7, Nr. 2, 1 Feb. 1995, pp. 170–172.

Wavelength converter based on integrated all–active three-port Mach–Zehnder interferometer by M. Schilling et al, EL Lett. Vole 30, No. 25, 1994, pp. 2128–2130.

New Photonic Device Integration by Selective–Area Movpe and Its Application to Optical Mod/Laser Integration (Invited Paper) by Suzuki, et al, Micro.Tec. Ltrs, vol. 7, No. 3, Feb. 1994.

"Novel Growth Techniques for the Fabrication of Photonic Integrated Circuits" by Coudenys et al, Mat. Res. Symp. Proc. vol. 240, 1992, pp. 15–16.

*Primary Examiner*—Brian Healy
*Attorney, Agent, or Firm*—Ware, Fressola, Van Der Sluys & Adolphson LLP

[57] ABSTRACT

An integrated optoelectronic semiconductor component is presented, which can equally process light signals of any polarization direction. Such semiconductor components are used for digital optical telecommunications. The semiconductor component has active (A) and passive (B) waveguide sections, which comprise a number of semiconductor layers (SP) with so-called multiple quantum well structures. The semiconductor layers (SP) are deposited by a process known as selective area growth (SAG). A portion of the semiconductor layers has a lattice constant which is smaller than the lattice constant of a substrate (SUB). This creates a biaxial tensile strain in these layers. The tensile strain is optimized in the active waveguide sections (A) to attain polarization independence. Furthermore a process is described whereby such a semiconductor component can be manufactured.

12 Claims, 2 Drawing Sheets

U.S. PATENT DOCUMENTS

| | | | |
|---|---|---|---|
| 4,979,970 | 12/1990 | Dannoux et al. | 385/14 X |
| 5,035,478 | 7/1991 | Ishikawa et al. | 385/14 X |
| 5,127,081 | 6/1992 | Koren et al. | 385/130 |
| 5,134,671 | 7/1992 | Koren et al. | 385/14 |
| 5,151,957 | 9/1992 | Riviere | 385/41 |
| 5,265,177 | 11/1993 | Cho et al. | 385/14 |
| 5,287,376 | 2/1994 | Paoli | 372/43 |
| 5,313,478 | 5/1994 | Baums et al. | 372/26 |
| 5,459,747 | 10/1995 | Takiguchi et al. | 372/50 |
| 5,701,379 | 12/1997 | Takeuchi | 385/131 |

FOREIGN PATENT DOCUMENTS

| | | | |
|---|---|---|---|
| 0612129 | 8/1994 | European Pat. Off. | 385/14 X |
| 0616243 | 9/1994 | European Pat. Off. | 385/14 X |
| 0662628 | 7/1995 | European Pat. Off. | 385/14 X |
| 0692853 | 1/1996 | European Pat. Off. | 385/14 X |
| 4117866 | 12/1992 | Germany | 385/14 X |
| 4429772 | 2/1995 | Germany | 385/14 X |
| 4433873 | 3/1995 | Germany | 385/14 X |
| 4410780 | 10/1995 | Germany | 385/14 X |
| 19515752 | 11/1995 | Germany | 385/14 X |
| 1204018 | 8/1989 | Japan | 385/14 X |
| 3102315 | 4/1991 | Japan | 385/14 X |
| 9531741 | 5/1995 | WIPO | 385/14 X |

MONOLITHIC INTEGRATED OPTOELECTRONIC SEMICONDUCTOR COMPONENT AND PROCESS FOR MANUFACTURING THE SAME

TECHNICAL FIELD

The invention concerns an integrated optoelectronic semiconductor component comprising active and passive optical waveguide sections disposed on a crystalline substrate which contain elongate, narrow portions of a continuous semiconductor layer structure comprising a number of semiconductor layers with alternately small and wide energy gaps, the thickness of the semiconductor layers in the active waveguide sections being greater than that in the passive waveguide sections. The invention also concerns a process for manufacturing such a semiconductor component.

BACKGROUND OF THE INVENTION

A configuration of such a component is known from the published European patent application EP 616 243. It describes an optical space switch which contains optical waveguides with active, i.e. controlled light-amplifying or light-absorbing waveguide sections, and passive waveguide sections, i.e. which conduct unamplified light. The optical waveguides contain a semiconductor layer structure whose layers have a different layer thickness in the active waveguide sections than in the passive waveguide sections. A process is also indicated whereby the active and passive waveguide sections can be deposited in a single coating process. This process utilizes the fact that no semiconductor material grows on substrate areas coated with a dielectric layer, and that the growing rate between sections masked with a dielectric layer increases as a function of the size of the adjacent masked surface.

The described optical space switch however has the disadvantage that its operation is polarization-dependent, i.e. light signals of different polarization directions receive different amplification or are absorbed in the active waveguide sections.

In addition, a wavelength converter with continuous active waveguides is known from an article by M. Schilling et al: "Wavelength converter based on an integrated all-active three-port Mach-Zehnder interferometer", El. Lett. Vol. 30 No. 25, 1994. This semiconductor component is also polarization-dependent and needs an expensive control with high power consumption for the different active waveguide sections.

An article by M. Aoki et al: "New Photonic Device Integration by Selective-Area MOVPE and Its Application to Optical Modulator/Laser Integration", IEEE Microw. and Opt. Tech. Let. Vol. 7, No. 3, 1994, describes in detail the method used in patent application EP 616243, which is known under the name of Selective Area Growth (SAG), for the example of a monolithic integrated semiconductor component with a laser and a modulator. So-called multiple quantum well structures are used as semiconductor layer structures which are semiconductor layers with alternately small and wide energy gaps. Energy gap means the energy difference between the valence band and the conductivity band of the semiconductor. The article recommends the process for the monolithic integration of a line of other components, particularly for photonic integrated circuits. However, the components manufactured in accordance with this process also have the disadvantage that they are polarization-dependent.

A further article by G. Coudenys et al: "Novel Growth Techniques for the Fabrication of Photonic Integrated Circuits", Mat. Res. Symp. Proc. Vol. 240, 1992, pages 15–26 cites a disadvantage of the selective area growth method in that the composition of the material of the growing semiconductor material, and therefore its lattice constant, changes in lateral sections masked with a dielectric layer.

An article by M. Joma et al: "Polarization Insensitive Semiconductor Laser Amplifiers with Tensile Strained InGaAsP/InGaAsP Multiple Quantum Well Structure", Appl. Phys. Lett. Vol. 62(2), pages 121–122, 1993, describes an optical amplifier with active tensile-strained multiple quantum well structures which operates independently of the polarization. This component however contains no passive waveguide sections and is manufactured in accordance with a process which does not enable the integration with passive waveguide sections.

SUMMARY OF THE INVENTION

It is therefore the task of the invention to find an integrated optoelectronic semiconductor component that is able to equally process light signals of any polarization direction. It is furthermore the task of the invention to present a process whereby such an integrated optoelectronic semiconductor component can be manufactured.

With regard to the component, the task is fulfilled by an integrated optoelectronic semiconductor component comprising active and passive optical waveguide sections disposed on a crystalline substrate which contain elongate, narrow portions of a continuous semiconductor layer structure comprising a number of semiconductor layers with alternately small and wide energy gaps, the thickness of the semiconductor layers in the active waveguide sections being greater than that in the passive waveguide sections, characterized in that the semiconductor layers with the small energy gap have a smaller lattice constant than the substrate.

With regard to the process, the task is fulfilled by a process for manufacturing an integrated optoelectronic semiconductor component comprising active and passive waveguide sections disposed on a substrate and each containing a number of semiconductor layers, the active waveguide sections being disposed between substrate surface areas covered with a dielectric layer, and the active and passive waveguide sections being deposited in a single vapor deposition process, characterized in that the composition of the material to be vapor-deposited is chosen so that at least part of the semiconductor layers is grown with a lattice constant less than that of the substrate.

BRIEF DESCRIPTION OF THE DRAWINGS

Two configurations of a component according to the invention and of the manufacturing process of the invention are described in the following by means of FIGS. 1 to 4, where.

BEST MODE FOR CARRYING OUT THE INVENTION

Figure 1:
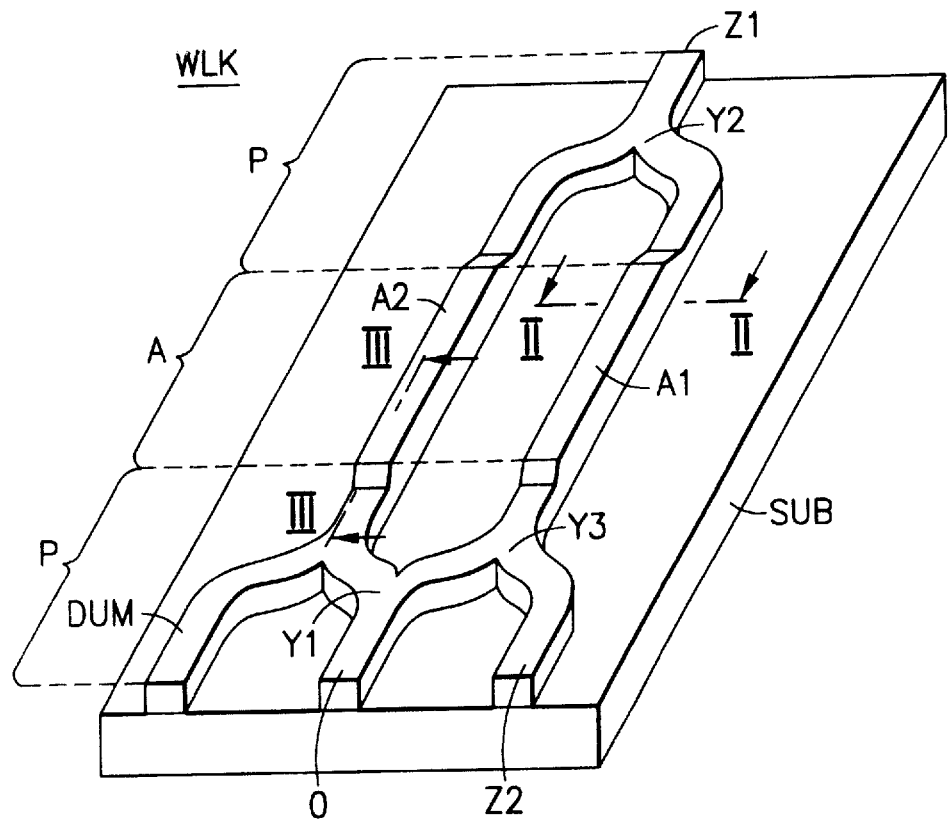
FIG. 1 is a schematic spatial view of a first configuration example.

FIG. 1 illustrates a first configuration example of an integrated optoelectronic semiconductor component of the invention, a so-called 3-port Mach-Zehnder interferometer wavelength converter WLK. It contains a substrate SUB on which an optical waveguide is located. The waveguide has active waveguide sections A, in which infiltrated light can be amplified as a function of injected current, and passive waveguide sections P, in which incoming light can be passed on without amplification. Two active waveguide sections A1 and A2 are optically switched in parallel through two passive Y-shaped branches Y1 and Y2, so that these active waveguide sections A1 and A2 have a common input Z1 and a common output O. One active waveguide section A1 has a second input Z2 via a third Y-shaped branch Y3. For reasons of symmetry, the second active waveguide section A2 can also have an input DUM, which is not used however. Light with a wavelength of $\lambda_1$ entering the common input Z1 can be modulated with a light signal of wavelength $\lambda_2$ entering through the second input Z2, where the saturation of the amplification is utilized in the active section A1.

Figure 2:
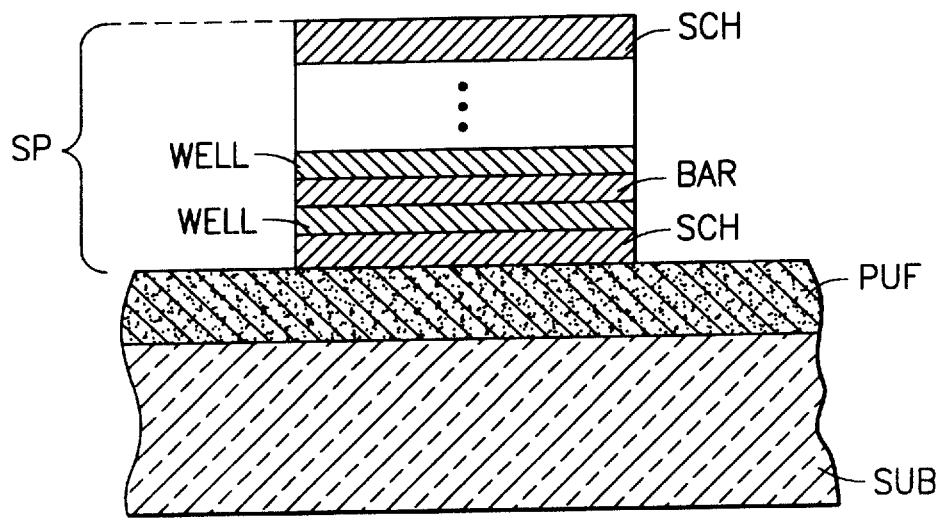
FIG. 2 is a vertical cut to the substrate through the waveguide layer structure along section line II—II.

The optical waveguide comprises a continuous semiconductor layer structure SP, which is deposited in a single coating process. FIG. 2 schematically illustrates the structure of the semiconductor layer SP in a cross section. It alternately contains semiconductor layers with a small energy gap WELL and semiconductor layers with a wide energy gap BAR.

Such a structure is called a multiple quantum well structure. The energy gap in a semiconductor layer is the difference in energy between the valence band and the conductivity band of the semiconductor, which form the layer. The uppermost and the lowest semiconductor layer is a waveguide layer SCH. A buffer layer PUF may be located between the substrate SUB and the semiconductor layer structure SP. The number of semiconductor layers with the wide and the small energy gap is between 1 and 30, but preferably 5.

FIGS. 1 and 2 do not illustrate one or more cover layers and a metal contact layer which are placed over the semiconductor layer structure SP.

Figure 3:
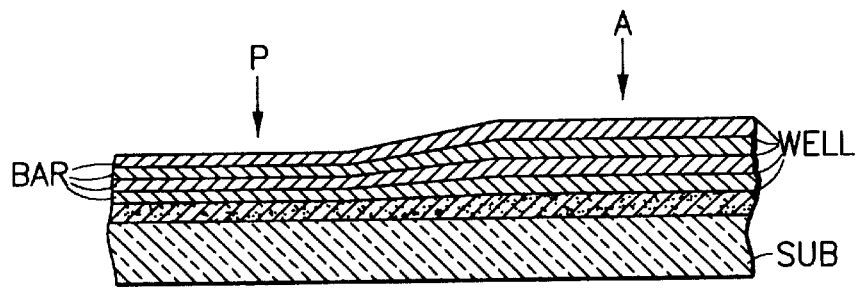
FIG. 3 is a cut along the optical waveguide in the transition area between an active and a passive waveguide section along section line II—II.

The semiconductor layers WELL and BAR in the active waveguide sections A are thicker than in the passive waveguide sections P. This is illustrated in FIG. 3 by a cut along a waveguide in the transition area between the active and the passive waveguide section. Only this difference in layer thickness makes it possible to operate the different sections of the optical waveguide at a predetermined lightwave length as active, i.e. controlled light-amplifying or light-absorbing waveguide sections, and passive waveguide sections, i.e. which conduct unamplified light. Continuous semiconductor layer structures in which the thickness of the layers in active waveguide sections is greater than in passive sections can be manufactured in accordance with a process known as Selective Area Growth (SAG), by arranging the waveguide in the active sections between areas of the substrate surface which are masked with a dielectric layer.

In this first configuration example, the substrate SUB and the buffer layer PUF are made of n-doped InP, the semiconductor layers with the wide energy gap BAR and the waveguide layers SCH are made of undoped InGaAsP, and the semiconductor layers with the small energy gap WELL are made of undoped InGaAs or InGaAsP. P-doped InP is used for the cover layers which are not shown in FIG. 1. The cited doping can also be of the respective reverse charge carrier type. The waveguide layers SCH can also be lightly doped. Other ternary and quaternary compounds such as InAIAs or InGaAIAs can be used for the waveguide layers SCH and the semiconductor layers BAR and WELL. Generally semiconductors of the II/VI or IV/IV compound type can be used in addition to different semiconductors of the III/V compound type.

While the composition of the semiconductor layers with the wide energy gap BAR is selected so that the lattice constants of these layers in the passive waveguide sections P are adapted to those of the substrate SUB, the composition in the semiconductor layers with the small energy gap WELL is such that they have a smaller lattice constant than the substrate (SUB).

This causes these layers to be under a biaxial tensile strain, which prompts a change in the energy band structure. Thus with a suitable tensile strain in the semiconductor layers in the active waveguide sections, light in a certain wavelength range, which is polarized along the substrate plane, is amplified to the same extent or absorbed as the light which is polarized vertically to the substrate plane. The operation of the semiconductor component is thus independent of the polarization direction of a light signal.

In the present structure the polarization independence is achieved with a tensile strain of about 0.3%, i.e. the lattice constant of the semiconductor layers with the small energy gap WELL is 0.3% smaller than that of the substrate SUB. In addition, the gallium content in the semiconductor layers with the small energy gap WELL is increased as opposed to the composition of nonstrained semiconductor layers. The usual tolerance range for the composition of the material of a nonstrained semiconductor layer is such that its lattice constant does not differ more than ±0.02% from the lattice constants of the substrate.

Polarization independence especially requires strain in the semiconductor layers with the small energy gap WELL in the active waveguide sections A. It is therefore important that the described 0.3% tensile strain exists in the active waveguide sections A. During the manufacture of the semiconductor components, the active waveguide sections A are arranged between areas of the substrate surface which are coated with a dielectric layer. The effect of this lateral masking is to change the composition of the material and thereby also the lattice constant of the semiconductor layers BAR and WELL in the active waveguide sections A, as compared to the composition of the material of the passive waveguide sections P. This effect must be compensated in order to obtain the desired tensile strain in the active waveguide sections A.

However the manufacture of the semiconductor component only allows control of the adjustment of the lattice constant in the passive waveguide sections P, because only those are accessible for a direct measurement, e.g. by means of X-ray diffraction. No direct determination of the lattice constant can be carried out in the active waveguide sections A, because these structures are only a few to some ten micrometers wide. For this reason a lattice constant, which is determined by means of calculations or experimental data, must be established in the passive waveguide sections P so that the desired tensile strain can be achieved in the active waveguide sections A.

Accordingly the compensation for the cited effect produces a different strain in the semiconductor layers in the passive waveguide sections P than in the active waveguide sections A. The effect of strains on the optical waveguide lines in the passive waveguide sections P is however minor, and therefore only plays a subordinate role in the polarization independence of the component. The indium content in the active waveguide sections A is increased in the present case, so that the lattice constant of the grown semiconductor layers is larger than in the passive waveguide sections P. This leads to a pressure strain in the active waveguide sections A, which must be balanced by an additional increase in the gallium content of the semiconductor layers with the small energy gap WELL.

The wavelength converter operates polarization independent with a tensile strain of 0.3% in the active A, and at 0.6% in the passive P waveguide sections, at a light wavelength of about 1550 nm. In that case the thickness d of the semiconductor layers with the small energy gap WELL in the active waveguide sections A is about $d_A$ 11 nm, and about $d_P$ 7 nm in the passive sections P. Because of the difference in thickness, the wavelength at which light is heavily absorbed in the passive section P is 1430 nm, and thereby is clearly separate from the working wavelength of 1550 nm of the active waveguide sections A. The passive waveguide sections P must therefore not be actively operated by injecting a pump current.

Another possibility of achieving polarization independence with a specific geometry of the optical waveguide comprises introducing an additional pressure strain in the semiconductor layers with the wide energy gap BAR by means of a larger lattice constant in the active waveguide sections A. In that way, in addition to the tensile strain in the semiconductor layers with the small energy gap WELL, the pressure strain in the semiconductor layers with the wide energy gap BAR is available as a degree of freedom for the manufacture of a semiconductor component.

Figure 4:
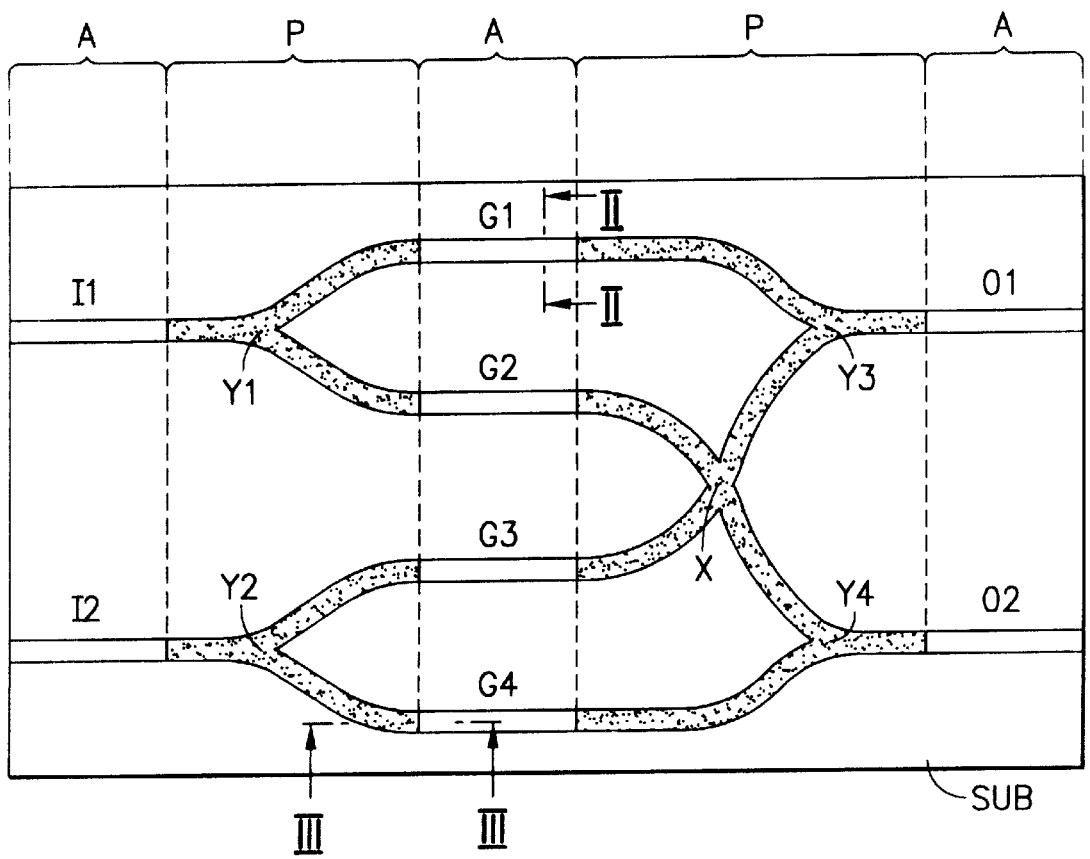
FIG. 4 is a schematic view of a second configuration example.

FIG. 4 illustrates a second configuration example of an integrated optoelectronic semiconductor component according to the invention, an optical 2×2 space switch RS. The figure schematically illustrates the optical waveguide which contains active waveguide sections A and passive waveguide sections P. The optical space switch RS has the same layer sequence as the wavelength converter WLK of the first configuration example illustrated in FIG. 2.

The optical space switch RS operates two active waveguide sections I1 and I2 as optical amplifiers and forms two input amplifiers. A Y-shaped branch Y1, Y2 respectively connects the active waveguide sections I1 and I2 to two further active waveguide sections G1 to G4, which operate as optical switches and absorb or amplify the incoming light depending on the electrical control. Two further passive Y-shaped branches connect the four optical switches G1 to G4 to two further active waveguide sections 01 and 02 which operate as output amplifiers, so as to establish a waveguide link from each input amplifier I1, I2 to each output amplifier 01, 02. This produces a crossing X of two waveguide branches. The crossing is configured so that light from one waveguide branch cannot enter the crossing waveguide branch.

As in the first configuration example, the layer thickness of the semiconductor layers is as shown in FIG. 3, so that the semiconductor layers in the active sections A are thicker than in the passive sections P. The substrate SUB and the buffer layer PUF are made of InP, the semiconductor layers with the wide energy gap BAR are made of InGaAsP with a lattice constant in the passive waveguide sections P which is adapted to the substrate SUB. The semiconductor layers with the small energy gap WELL are made of InGaAs or InGaAsP with increased gallium content as compared to the lattice-adapted semiconductor layers, and therefore with a smaller lattice constant.

The process whereby the semiconductor components WLK, RS of the two configuration examples are manufactured has essentially the following steps:

In a first step a dielectric layer, e.g. of $SiO_2$, is deposited as a mask on a substrate SUB made of InP. It is structured so that narrow strips which define the subsequent optical waveguide remain open. In active waveguide sections A the narrow strip is bound laterally by large-area masked sections. The lateral boundary created by the mask is missing in passive waveguide sections P, or they only have a narrow lateral mask.

The semiconductor layer structure SP is deposited in a second step, a single coating process without intermediate masking and etching steps. The coating process includes a series of epitaxial steps whereby individual semiconductor layers are sequentially deposited by precipitating semiconductor material from the gas phase. The Metal Organic Vapor Phase Epitaxy (MOVPE) method is used for the precipitation. In the individual epitaxy steps, first a buffer layer PUF of InP, a waveguide layer SCH of InGaAsP, then alternately a semiconductor layer WELL of InGaAs or InGaAsP with a small energy gap, and a semiconductor layer BAR of InGaAsP with a wide energy gap, and finally a second waveguide layer SCH of InGaAsP are sequentially deposited. The composition of the components in the gas phase is always adjusted for growing the waveguide layers SCH and the semiconductor layers with the wide energy gap BAR with a lattice constant which in the passive waveguide sections P is adapted to the lattice constant of the substrate SUB, and the semiconductor layers with the small energy gap WELL, with a lattice constant in the active waveguide sections A which is about 0.3% smaller.

In the passive waveguide sections P, or in semiconductor layers which were grown on an unmasked test substrate, the lattice constant of the semiconductor layers with the small energy gap WELL in properly adjusted configuration examples is about 0.6% smaller than that of the substrate SUB. This can be measured e.g. with X-ray diffraction. A corrective value must generally be added to the desired lattice constant in active waveguide sections A. This corrective value must be determined by means of simulation calculations or experimental data, e.g. from fluorescent light measurements or from measurements of the polarization dependence in finished semiconductor components. The composition of the component materials in the gas phase must be selected so that the semiconductor layers with the small energy gap WELL in the passive waveguide sections P can grow with this corrected lattice constant.

In a third step the dielectric layer is removed and in the case where a lateral boundary created by the mask is missing in the passive waveguide sections P, the optical waveguide in these sections is formed from the semiconductor layer structure SP by means of etching. Subsequently one or more cover layers, e.g. of InP, and a metal layer are deposited.

What is claimed is:

1. An integrated optoelectronic semiconductor component comprising active (A) and passive (P) optical waveguide sections disposed on a crystalline substrate (SUB) which contain elongate, narrow portions of a continuous semiconductor layer structure (SP) comprising a number of semiconductor layers with alternately small (WELL) and wide (BAR) energy gaps, the thickness of the semiconductor layers in the active waveguide sections (A) being greater than that in the passive waveguide sections (P), characterized in that the semiconductor layers with the small energy gap (WELL) have a smaller lattice constant than the substrate (SUB).

2. A semiconductor component as claimed in claim 1, characterized in that in the passive sections (P) the semiconductor layers with the small energy gap (WELL) have a smaller lattice constant than in the active sections (A).

3. A semiconductor component as claimed in claim 2, characterized in that in the passive sections (P) the semiconductor layers with the wide energy gap (BAR) have the same lattice constant as the substrate (SUB).

4. A semiconductor component as claimed in claim 2, characterized in that in the active sections (A) the semiconductor layers with the wide energy gap (BAR) have a greater lattice constant than the substrate (SUB).

5. A semiconductor component as claimed in claim 4, characterized in that two active waveguide portions (A1, A2) are optically connected in parallel via passive Y-junctions (Y1, Y2) and have a common input port (Z1), and that one (A1) of the two active waveguide portions (A1, A2) has a second input port (Z2) via a further passive Y-junction (Y3).

6. A process for manufacturing an integrated optoelectronic semiconductor component comprising active (A) and passive (P) waveguide sections disposed on a substrate (SUB) and each containing a number of semiconductor layers (SP), the active waveguide sections being disposed between substrate surface areas covered with a dielectric layer, and the active and passive waveguide sections being deposited in a single vapor deposition process, characterized in that the composition of the material to be vapor-deposited is chosen so that at least part of the semiconductor layers (SP) is grown with a lattice constant less than that of the substrate (SUB).

7. A process as claimed in claim 6, characterized in that the substrate is made of InP and the semiconductor layers are made of InGaAsP or InGaAs, and that in the vapor phase the Ga content is increased as compared to the composition of the material in the vapor phase in which the semiconductor layers are grown with a lattice constant adapted to the substrate (SUB).

8. A semiconductor component as claimed in claim 1, characterized in that in the passive sections (P) the semiconductor layers with the wide energy gap (BAR) have the same lattice constant as the substrate (SUB).

9. A semiconductor component as claimed in claim 1, characterized in that in the active sections (A) the semiconductor layers with the wide energy gap (BAR) have a greater lattice constant than the substrate (SUB).

10. A semiconductor component as claimed in claim 1, characterized in that two active waveguide portions (A1, A2) are optically connected in parallel via passive Y-junctions (Y1, Y2) and have a common input port (Z1), and that one (A1) of the two active waveguide portions (A1, A2) has a second input port (Z2) via a further passive Y-junction (Y3).

11. A semiconductor component as claimed in claim 2, characterized in that two active waveguide portions (A1, A2) are optically connected in parallel via passive Y-junctions (Y1, Y2) and have a common input port (Z1), and that one (A1) of the two active waveguide portions (A1, A2) has a second input port (Z2) via a further passive Y-junction (Y3).

12. A semiconductor component as claimed in claim 3, characterized in that two active waveguide portions (A1, A2) are optically connected in parallel via passive Y-junctions (Y1, Y2) and have a common input port (Z1), and that one (A1) of the two active waveguide portions (A1, A2) has a second input port (Z2) via a further passive Y-junction (Y3).

* * * * *